United States Patent [19]

McFarland, Jr.

[11] Patent Number: 4,736,124
[45] Date of Patent: Apr. 5, 1988

[54] HIGH SPEED DATA BUS STRUCTURE

[76] Inventor: Harold L. McFarland, Jr., 444 Saratoga Ave. #4G, Santa Clara, Calif. 95050

[21] Appl. No.: 850,471

[22] Filed: Apr. 10, 1986

Related U.S. Application Data

[62] Division of Ser. No. 603,476, Apr. 24, 1984, Pat. No. 4,595,923, which is a division of Ser. No. 313,525, Oct. 21, 1981, abandoned.

[51] Int. Cl.⁴ .................. H03K 19/21; H03K 19/086; H03K 17/62
[52] U.S. Cl. .................................... 307/471; 307/262; 307/254; 307/455; 307/494
[58] Field of Search ............... 307/242, 262, 471, 494, 307/510, 513, 269, 454, 455, 254

[56] References Cited

U.S. PATENT DOCUMENTS

| | | | |
|---|---|---|---|
| 3,432,650 | 3/1969 | Thompson | 328/160 |
| 4,256,980 | 3/1981 | Asada et al. | 307/254 |
| 4,258,274 | 3/1981 | Nagashima et al. | 307/254 |
| 4,308,471 | 12/1981 | Misawa | 328/160 |
| 4,435,656 | 3/1984 | Tomuro | 307/262 |

Primary Examiner—John Zazworsky
Attorney, Agent, or Firm—Townsend and Townsend

[57] ABSTRACT

A very high speed data bus system for communication among the various functional units that may constitute a large computer system. The bus communication medium comprises a number of line pairs on the backplane, and the bus system comprises a bus control unit for arbitrating requests from a plurality of interface units or ports, there being one such port associated with each functional unit. The functional units are densely packed, that is, mounted in immediately adjacent connectors to define a populated section of the backplane in which all connectors have ports coupled thereto, and one or two unpopulated sections of the backplane in which the connectors are empty. In the populated section, the effective characteristic impedance, designated $Z_O'$, is lower than the effective characteristic impedance, designated $Z_O$, in the unpopulated region. A populated end of the transmission line is resistively terminated with a resistance corresponding to $Z_O'$ while the unpopulated end is terminated with a resistance corresponding to $Z_O$. The border between the populated and unpopulated sections is terminated with a resistance corresponding to $1/(1/Z_O' - 1/Z_O)$, designated $Z_O''$, thus eliminating signal reflections that could compromise data integrity and degrade system performance.

The two lines that define each differential line pair may be effectively crossed over between successive connectors on the backplane so that an individual line is connected alternately to the positive and negative receiver input terminals at successive ports. Driver gating circuitry responsive to first and second data input signals, an enable signal, and a conditional inversion input signal performs multiple levels of gating with a minimum of propagation delay. The preferred differential receiver amplifies a relatively low level differential input signal and performs an exclusive or function with a conditional inversion signal with a miniumum propagation delay between the signal input and an output line pair.

3 Claims, 2 Drawing Sheets

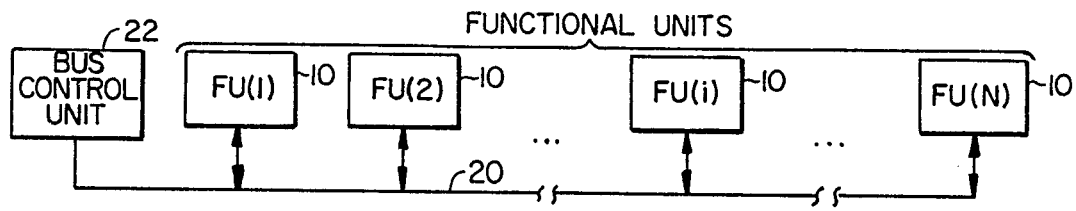
FIG._1.
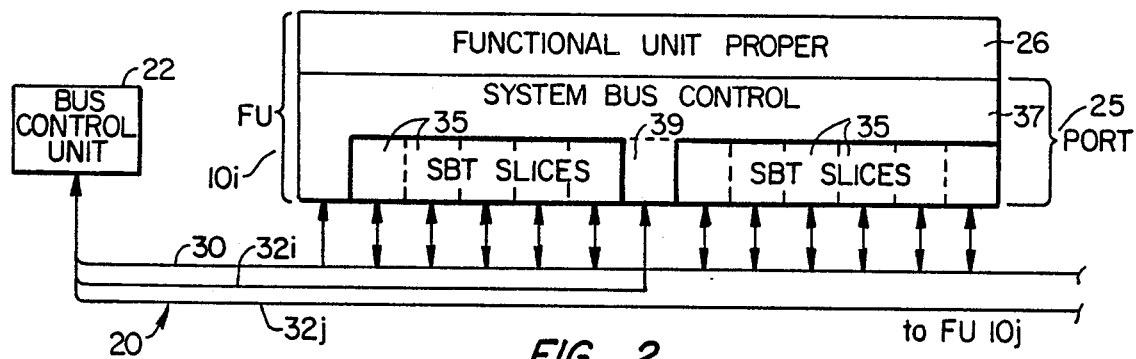
FIG._2.
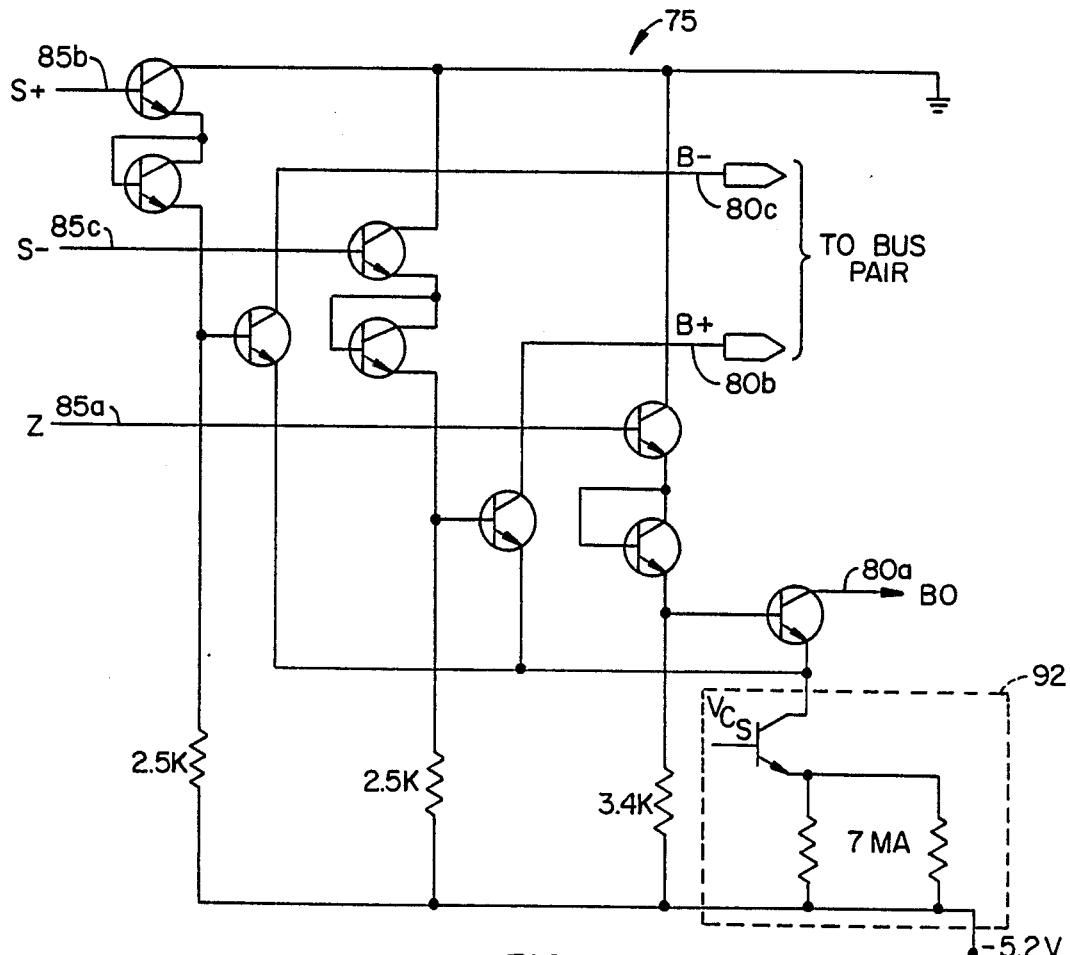
FIG._3.

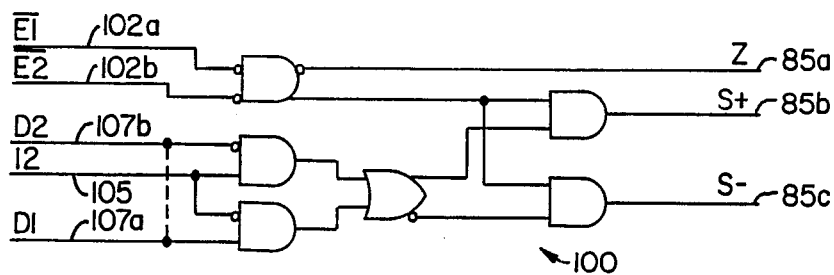
FIG._4A.
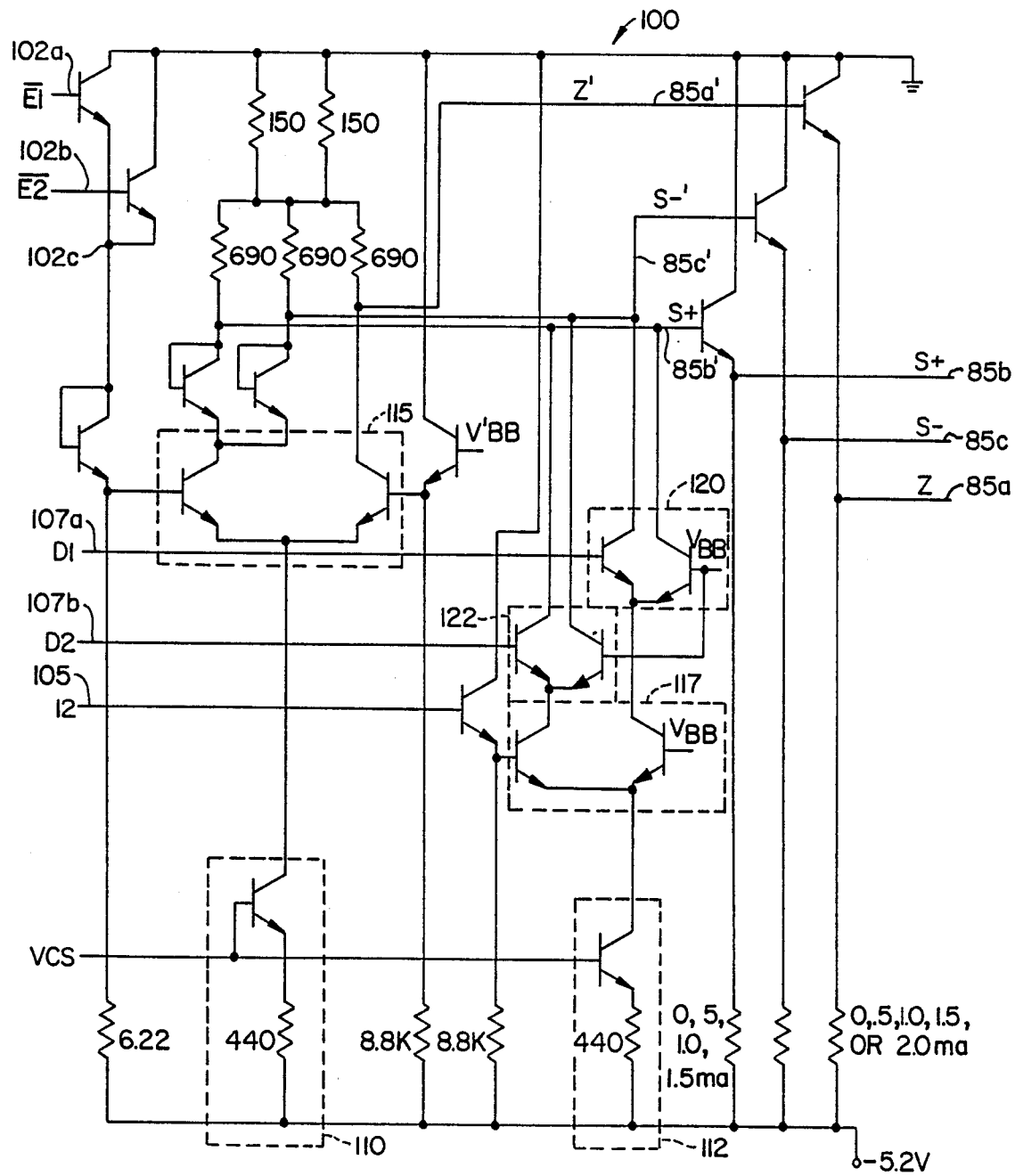
FIG._4B.

HIGH SPEED DATA BUS STRUCTURE

This is a division of application Ser. No. 603,476, filed Apr. 24, 1984, now U.S. Pat. No. 4,595,923, which is itself a division of application Ser. No. 313,525, filed Oct. 21, 1981, now abandoned.

FIELD OF THE INVENTION

The present invention relates to a high speed data communication bus system.

BACKGROUND OF THE INVENTION

A bus system provides a structure including communication paths over which a plurality of functional units may communicate signals among one another. It is typically contemplated that a common set of signal lines ("party lines") will be used, with the various functional units being connected in parallel to the party lines. The bus system may also include a number of "private" lines that provide communication paths between particular functional units. Although the term "bus" is sometimes used to refer to the signal lines themselves, or perhaps only the party lines, the term is often taken to include, in addition to the signal lines, the interface electronics ("ports") associated with the functional units for transmitting and receiving signals according to a specified bus protocol. The bus system also typically comprises centralized or distributed logical units for arbitrating requests from functional units for use of the bus.

The signal lines are sometimes implemented as generally parallel traces on a printed circuit board, known as a "backplate," with the circuit boards for the functional units plugging into connectors that hold the functional unit boards perpendicular to the plane of the backplane and perpendicular to the direction of the backplane circuit board traces. The signal line define, along with a nearby power plane at a fixed DC level (for example, ground), respective transmission lines along which the bus signals propagate. A so-called "differential" bus dedicates a pair of lines to a given signal, with a voltage difference between the lines defining the signal polarity.

As attempts are made to increase the speed of data communication on the bus, the travel time of the signals along the backplane becomes an increasingly significant factor. For example, if a differential bus is used, differential delay between lines of a line pair results in distortion of the data. Moreover, care must be taken to avoid spurious signals arising from reflections that occur at impedance discontinuities. Such discontinuities are present, for example, where the signal driver for a given functional unit is characterized by a low output impedance when it is in its sending state. Thus, it is necessary to wait for the signal level change resulting from a first device's turning off its bus drivers to propagate past the bus drivers of a second device before allowing the second device to enable its bus drivers to transmit on the bus. Alternately, if the second device is allowed to enable its bus drivers so as to cause reflections, it is necessary to wait until such reflections propagate past the intended recipient of the second device's transmission before allowing the intended recipient to receive the transmission. In either event, bus "turnaround" requires extra "settling time" which slows down the system.

Accordingly, while the use of a backplane bus is attractive from a convenience and economy standpoint, the above limitations on speed have tended to make backplane buses unsuitable for large, high-speed computer systems.

SUMMARY OF THE INVENTION

The present invention provides improved driver and receiver circuitry for a very high speed data bus system as might be used in a large computer.

Each port includes an appropriate number of receivers and drivers for the transmission line pairs. Party line bus signals on a given line pair are driven by a three-state differential current-mode bus driver that selectively sinks a predetermined current on either or neither line of the transmission line pair, and received by differential receivers. An advantage of the current mode drivers is that, unlike voltage-mode drivers, they have a very high output impedance so that a signal propagating on the bus encounters no significant discontinuity in line impedance when it passes a current-mode driver that is enabled. Thus reflections are avoided and high speed bus "turnaround" is possible. Moreover, current mode transmission does not require the very high output current normally required by voltage mode buses when driving lines with low effective characteristic impedances.

According to a further aspect of the invention, the two lines that define each differential line pair may be effectively crossed over between successive connectors on the backplane so that an individual line is connected alternately to the positive and negative receiver input terminals at successive ports. This pseudo-twisted-pair configuration has the advantage of evening out any systematic imbalances between lines of a given line pair. For example, imbalances in capacitive loading can result in the lines of a pair having different effective impedances and propagation velocities, thus converting common mode noise to normal mode noise. The advantage of the pseudo-twisted-pair configuration is achieved at the expense of somewhat more complicated logic in the drivers and receivers, since the polarity of signals transmitted and received by a given port depends on the at port's position on the bus.

According to the invention, driver gating circuitry responsive to first and second data input signals, an enable signal, and a conditional inversion input signal performs multiple levels of gating with a minimum of propagation delay. The driver gating circuitry comprises first and second differential pairs for receiving the respective data input signals. The paired outputs of each of the differential pairs are coupled to a pair of S+ and S− output lines, but with opposite polarities for the two differential pairs. A first current source is steered by a first current steering network controlled by the conditional inversion input signal, and selectively activates one or the other of the differential pairs so that one of the S+ and S− outputs is pulled to an inactive level. A second current source is steered by a second current steering network controlled by the enable input signal. When the enable signal is present, a Z output line is pulled to an inactive level; when absent the more active of the S+ and S− lines is pulled to an inactive level. In an embodiment wherein the pseudo-twisted line pair configuration is not used, the gating circuitry functions as a 2:1 multiplexer to selectively couple either of two signal sources onto the bus, with the conditional inversion input functioning as the data select line.

For a further understanding of the nature and advantages of the present invention, reference should be made to the remaining portions of the specification and to the attached drawings.

BRIEF DESCRIPTION OF THE DRAWINGS

FIG. 1 is an overall block diagram of a data communication system utilizing the bus system according to the present invention;

FIG. 2 is a block diagram showing the communication between a given port and the central bus control unit;

FIG. 3 is a circuit schematic of the current drivers within a SBT slice; and

FIGS. 3A and 4B are logical and circuit schematics of the driver gating.

DETAILED DESCRIPTION OF THE INVENTION

Overview

FIG. 1 is a block diagram illustrating a bus system that permits a plurality of functional units 10 to communicate with one another. A set of data communication lines 20 provide signal paths among functional units 10, and between functional units 10 and a bus control unit (BCU) 22.

FIG. 2 is a block diagram showing the manner in which a given functional unit 10i communicates with BCU 22 and other functional units over communication lines 20. As seen above, the various functional units within the system may be very different from one another. However, each functional unit has associated with it a port 25 that interfaces to lines 20. All the ports in the system are essentially identical.

In the remaining portions of the specification, the term "functional unit" will sometimes be used to refer to the portions of the functional unit exclusive of the port Where the distinction is important, a term such as "the functional unit proper" will be used to describe the portion of the functional unit without the port. Where appropriate, the functional unit proper will be assigned a reference numeral 26.

Communication lines 20 include a set of common or party lines 30, signals appearing on which are communicated to all functional units. In the discussion that follows, party lines 30 will often be referred to as the "bus."

Port 25 includes eleven integrated circuit chips 35, hereinafter called "SBT (system bus transceiver) slices," and SBC (system bus control) circuitry 37 that interfaces the SBT slices to the rest of the functional unit. Each SBT slice contains I/O buffer registers, parity logic, address recognition logic, and ten bus transceivers (each having a differential receiver and a current mode driver, to be described below), and communicates with a particular subset of ten line pairs of party lines 30.

SBT slices 35 and the major part of SBC circuitry 37 are each implemented as a single integrated circuit chip of the type sold under the Motorola Semiconductor Products, Inc. trademark "MECL 10,000 Macrocell Array." A "Macrocell" chip is a cellular logic array that allows a semi-custom chip design to be developed by providing a large number of transistors and resistors organized in discrete regions of the chip (cells). The transistors and resistors may be interconnected according to a library of cell designs to provide latches, flip-flops, gates and the like. In the chip type used herein, the cell complement consists of 48 so-called "major" cells, each including approximately 100 discrete components (resistors and transistors), 32 so-called "interface" cells, each including approximately 31 discrete components, and 26 so-called "output" cells, each including approximately 29 discrete components. The components included in major and interface cells are designed for relatively low-power circuits which produce internal signals that are confined to the chip itself, while the output cell components are designed primarily for the higher power requirements of driving signals out of the chip. The receivers and drivers within port slices 35 are specially designed for this particular application.

The "Macrocell" chip within portion control circuitry 37 is assigned a reference numeral 39, and will be hereinafter referred to as the system bus control chip or the SBC chip.

Bused Signals—Bus Transceivers

The following discussion describes the circuitry within SBT slices 35 for driving and receiving signals on bus lines 30, and communicating such signals with the functional unit proper and the SBC chip.

The BIQ signals, as discussed above, are bused on differential pairs of lies in the system backplane. Each signal is driven by a three-state differential current-mode bus driver 75, a circuit schematic of which is shown in FIG. 8. Driver 75 is capable of selectively sinking 7 ma of current on one of three lines 80a, 80b, and 80c, designated B0, B+, and B−, respectively, depending respectively on the state of logic signals Z, S−, and S+ at respective inputs 85a, 85b, and 85c. Driver gating circuitry, to be described below, operates to ensure that one and only one of inputs 85a-c is high.

B+ line 80b and B− line 80c are coupled to respective lines of a bussed pair on the backplane, while B− line 80a is connected to ground. Driver 75 includes a constant current source 92 that is coupled to one of lines 80a-c, depending on which of inputs 85a-c is high (S+ high sinks current from B−). Since driver 75 operates into an effective impedance of about 15 ohms (transmission line characteristic impedance of about 30 ohms driven in both directions), the result is an output voltage differential of approximately ±105 millivolts.

FIG. 4A is a logical schematic illustrating drive gating circuitry 100 operable to provide suitable voltage levels for Z, S+, and S− lines 85a-c to control current driver 75. Driver gating circuitry 100 has enable input lines 102a and 102b, designated $\overline{E1}$ and $\overline{E2}$, respectively, a conditional inversion line 105, designated I2, and data input lines 107a and 107b, designated D1 and D2, respectively.

Driver gating circuitry 100 is operable to place a high level on one and only one of output lines 85a-c so that the current may be steered appropriately, as discussed above. $\overline{E1}$ and $\overline{E2}$ enable lines 102a-b are gated so that if either is high, Z is high, and S+ and S− are both low. Assuming both $\overline{E1}$ and $\overline{E2}$ are low, Z is low, and exactly one of S+ and S− is high, depending on D1, D2, and I2. I2 performs a selective switching function in that S+ corresponds to D1 when I2 is low, and corresponds to the complement of D2 when I2 is high.

For the regular current driver application, enable inputs 102a-b are connected and data inputs 107a-b are connected to provide, in effect, a single enable input and a single data input. Then S+ corresponds either to the data input or its complement, depending on I2. That is, circuitry 100 performs an exclusive-OR function, or, put another way, I2 performs a selective inversion of the data input. The selective inversion is necessitated by the use of pseudo-twisted line pairs as described above. The level on I2 is conveniently alternated from connector to connector by distributing either a pair of different DC levels on a pseudo-twisted line pair in the manner described above, or a single DC level on a single line which couples to every second connector.

While it is straightforward to describe and specify the operation of drive gating circuitry 100 in terms of logical gates as shown in FIG. 4A, there are several technical problems in implementing such circuitry. The general problem is speed, because propagation delays through multiple gating stages significantly slow down the response of the circuitry and the possible speeds obtainable on the bus. Moreover, in order that full voltage may be developed on the bus, it is required that there be minimum overlap of high levels on Z, S+ and S− lines 85a–c. Also, in order that current driver 92 not become saturated, there must be substantially no overlap of low signals. If all three of the lines were to be low for any significant duration, the transistor in driver current source 92 could saturate, so that when one of lines 85a–c went high, the response would be slow. Saturation could also have the effect of draining the bias supply $V_{cs}$ which would degrade performance of other circuitry on the chip.

FIG. 4B is a circuit schematic of the precise circuitry used to implement drive gating circuitry 100 to provide essentially a one-stage circuit having minimum overlap at high levels of the outputs and substantially no overlap at low levels of the output. Broadly, the gating is carried out by current steering rather than passing the signals through multiple gating stages.

Z, S+, and S− are the outputs of respective emitter followers having respective internal bus inputs 85a′, 85b′, and 85c′ designated Z′, S+′, and S−′, respectively. Driver gating circuitry 100 utilizes first and second current sources 110 and 112, and respective first and second current steering networks 115 and 118, each of which includes a differential transistor pair (hereinafter called a "differential pair").

D1 controls a first differential pair 120 tied to S+′ and S−′ while D2 controls a second differential pair 122 tied in the reverse order to S+′ and S−′. Current steering network 117 is controlled by I1, and steers current source 112 to either of the two differential pairs so that one or the other of S+′ and S−′ is pulled low. E1 and E2 control current steering network 115 to steer current source 110 to pull either Z′ low (leaving one of S+′ and S−′ high), or pull the higher of S+′ and S−′ low (leaving Z′ high and both S+′ and S−′ low).

When only one of the the E inputs 102a and 102b is used, the other is eliminated by tying it to the emitter of its input transistor 102c.

I claim:

1. Gating circuitry responsive to an enable input signal, first and second data input signals, and a selective inversion input signal, and having three output lines designated Z, S+, and S−, whereupon the absence of an enable signal causes Z to be at an active level and both S+ and S− at an inactive level, and the presence an enable signal causes S+ and S− to be at complementary levels with one or the other active, with S+ at a level representative of said first data input signal or at a level representative of the complement of said second data input signal, depending on said selective inversion input signal, comprising:

a first differential transistor pair having a data input for receiving said first data input signal, and having outputs coupled to said S+ and S− output lines;

a second differential transistor pair having a data input for receiving said second data input signal and having outputs coupled to said S+ and S− output lines;

said outputs of said first and second differential transistor pairs being coupled to said S+ and S− output lines with opposite polarities;

a first current source;

a first current steering network controlled by said selective inversion input signal to selectively actuate one or the other of said first and second differential transistor pairs so that one of said S+ and S− outputs is pulled to an inactive level;

a second current source;

a second current steering network controlled by said enable input signal, the presence of an enable signal causing said Z output line to be pulled to an inactive level, the absence of an enable signal causing said Z output line to remain at an active level while the one of the S+ and S− lines at a more active level is pulled to an inactive level;

said circuit thereby being operable to perform multiple levels of gating with a minimum of propagation delay.

2. The invention of claim 1 wherein said data inputs of said first and second differential transistor pairs are coupled to one another so that said circuit provides a gated exclusive OR function.

3. The invention of claim 1 wherein said active level is positive with respect to said inactive level.

* * * * *